United States Patent Office 3,763,224

Patented Oct. 2, 1973

3,763,224

PHOTOPOLYMERIZABLE COMPOSITIONS

Gerald I. Nass, West New York, and Gerhard E. Sprenger, Carlstadt, N.J., assignors to Sun Chemical Corporation, New York, N.Y.

No Drawing. Original application Apr. 4, 1969, Ser. No. 813,756, now Patent No. 3,650,885. Divided and this application Jan. 11, 1971, Ser. No. 105,631

Int. Cl. C07c *69/54*

U.S. Cl. 260—486 H 5 Claims

ABSTRACT OF THE DISCLOSURE

Ethylenically unsaturated esters of halogenated ring compounds are capable of photocuring in the absence of a photoinitiator.

This application is a division of copending application Ser. No. 813,756, filed Apr. 4, 1969 now U.S. Pat. 3,650,885.

This invention relates to energy-curing compounds and to processes of energy-curing compounds. More particularly, the invention relates to autophotopolymerizable ethylenically unsaturated compounds.

The use of photopolymerizable ethylenically unsaturated monomeric materials in coating compositions, adhesives, printing inks, and the like is known. It is also known that such monomeric materials are converted into polymers by the action of radiation and that they will polymerize at an improved rate when exposed to radiation in the presence of a photoinitiator, as in, for example, copending applications Ser. No. 556,568 (now abandoned) and Ser. No. 685,259.

There are a number of disadvantages connected with the use of a photoinitiator along with the monomer in a photopolymerizable system. In the first place, photoinitiators must be activatable by radiation, such as ultraviolet light, electron beam radiation, or gamma radiation. At the same time they must be thermally inactive at ambient temperatures in order to secure the storage and handling stability of the compositions containing them. In addition, the photoinitiator must be compatible with the monomer and the other ingredients, if any, in the system; for example, the initiator may have only a limited solubility in the selected monomer, thus decreasing the speed of the photopolymerization which to some extent is proportional to the concentration of the initiator in the system. It is also possible for the presence of an initiator to limit the use of other additives in the composition, thus preventing the attaining of the physical properties required for optimum performance in the desired end use.

It has now been found that certain compounds autopolymerize upon exposure to a source of radiation, that is, they photopolymerize in the absence of a photoinitiator at a rate comparable to, or in some cases better than, the speed of previously disclosed monomers in the presence of a photoinitiator.

In general the compounds of this invention are esters of ethylenically unsaturated acids containing halogenated ring compounds having at least one active hydrogen atom left unsubstituted in the nucleus or in a side chain. While this invention will be described broadly in terms of acrylates of chlorinated cyclic compounds, it is to be understood that this invention is not limited thereto. The ester may be a methacrylate or an itaconate as well as an acrylate, or it may be a mixed or a hetero-ester of two or more of these acids. The halogen atom may be bromine, iodine, or fluorine as well as chlorine.

The photopolymerizable compounds of this invention are the esters of halogenated cyclic compounds with acrylic acid, methacrylic acid, itaconic acid, and the like, and their mixtures. The cyclic compound may be any of a large variety of compounds, such as for example

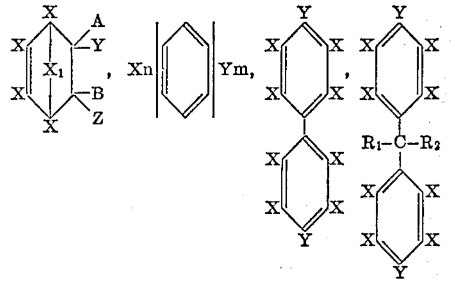

and the like, where X is H or a halogen atom, i.e., Cl, Br, I, or F, and at least one X must be a halogen atom and, in the absence of A or B, one X must be a hydrogen atom; A and B is each —O, —COO, or an alkylene group having 1 to 3 carbon atoms: Y and Z is each —H, —OH, —(R—O)*a*H, or —R where R is a straight chain or branched chain aliphatic radical having 1 to 3 carbon atoms and *a* is an integer of 1 to 10; *n* and *m* is each an integer of 1 to 5 and $n+m=6$; $R_1$ and $R_2$ may be the same or different and represent —H or —$CH_3$.

Representative of the halogenated ring compounds are 1,4,5,6,7,7-hexachloro - 2,3 - bis(hydroxymethyl)-bicyclo (2,2,1)-5-heptene (known commercially as HET-Diol and sold by Hooker Chemical Company), having the formula

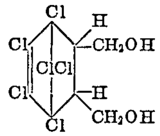

2,3,5,6-tetrachlorobenzene-1,4-dimethanol; 3,4,5,6-tetrachlorobenzene-1,2-dimethanol; 2,4,5,6 - tetrachlorobenzene-1,3-dimethanol, having the formula

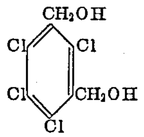

a polypropylene oxide adduct of tetrachlorobisphenol A, e.g., 2,2[1]-[isopropylidene bis (2,6-dichloro-p-phenoxy)] polypropylene oxide diol, having the formula

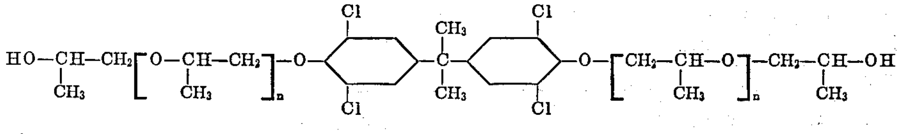

where $n \cong 0.9$; 3,5-dibromosalicyclic acid; 5,6,7,8,9,9-hexachloro-1,2,3,4,4a,8,8-octahydro - 5,8 - methano-2,3-naphthalene dicarboxylic acid; 2,4,5,6-tetraiodobenzene-1,3-dimethanol; 2,3,5,6 - tetrafluorobenzene-1,4-dimethanol; and the like; and mixtures thereof.

These compounds are converted into esters by any known and convenient means, such as by the ester interchange method of interacting a lower alkyl ester of the acid with the halogenated cyclic hydroxy compound in the presence of a suitable catalyst or by the direct reaction of the cyclic hydroxy compound with, e.g., acrylic or methacrylic acid or in known manner with an acryl or a methacrylyl halide. The resulting ester will have at least 1 halogen atom, and preferably 4 halogen atoms, in the ring and at least one hydrogen atom in the ring or in a side chain.

Specific examples of suitable esters include 1,4,5,6,7,7-hexachloro-bicyclo(2,2,1)-5-heptene-2,3 - bis(methylacrylate); 2,4,5,6-tetrachlorobenzene-1,3 - dimethylacrylate; 2,3,5,6 - tetrachlorobenzene-1,4-dimethylacrylate; 3,4,5,6-tetrachlorobenzene - 1,2 - dimethylacrylate; 3,4,5,6-tetrachlorobenzene-1,2-diacrylate; a mixture of the diacrylates of the three isomeric tetrachlorobenzene dimethanols; the esterification product of tetrachlorophthalic anhydride with two moles of 2-hydroxyethylacrylate; the diacrylate of 2,2[1][isopropylidene bis(2,6-dichloro-p-phenoxy)] dipropylene oxide diol; methacrylyl-3,5-dibromosalicylic acid; a polyester of 2,4,5,6 - tetrachlorobenzene-1,3-dimethanol with itaconic acid; 2,4,5,6-tetraiodobenzene-1,3-dimethyl diacrylate; 2,3,5,6 - tetrafluorobenzene-1,4-dimethylacrylate; and the like, as well as prepolymers thereof, i.e., dimers, trimers, and other oligomers, and their mixtures.

While the novel esters of this invention may photopolymerize at satisfactory rates in the absence of photoinitiating additives, their photocuring rates can be increased by the addition thereto of a photoinitiator. Examples of suitable photoinitiators include the following: acyloin or an acyloin derivative, such as benzoin, benzoin methyl ether, benzoin ethyl ether, desyl bromide, desyl chloride, desyl amine, and the like; and halogenated aliphatic, alicyclic, and aromatic hydrocarbons and their mixtures in which the halogen atoms are attached directly to the ring structure in the aromatic and alicyclic compounds, that is, the halogen is bonded directly to the aromatic hydrocarbon nucleus, and the halogen atoms are attached to the carbon chain in the aliphatic compounds. The halogen may be chlorine, bromine, fluorine, or iodine. Examples of such photoinitiators include polychlorinated polyphenyl resins, such as the Aroclors (Monsanto Chemical Company) which in general are polychlorinated diphenyls, polychlorinated triphenyls, and mixtures of polychlorinated diphenyls and polychlorinated triphenyls; polyfluorinated phenyls (E.I. du Pont de Nemours & Co.); chlorinated rubbers, such as the Parlons (Hercules Powder Company); copolymers of vinyl chloride and vinyl isobutyl ether, such as Vinoflex MP–400 (BASF Colors and Chemicals, Inc.); chlorinated aliphatic waxes, such as Chlorowax 70 (Diamond Alkali, Inc.); perchloropentacyclodecane, such as Dechlorane+ (Hooker Chemical Co.); chlorinated paraffins, such as Clorafin 40 (Hooker Chemical Co.) and Unichlor–70B (Neville Chemical Co.); mono- and polychlorobenzenes; mono- and polybromobenzenes; mono- and polychloroxylenes; mono- and polybromoxylenes; dichloromaleic anhydride; 1-(chloro-2-methyl) naphthalene; 2,4 - dimethylbenzene sulfonyl chloride; 1 - bromo-3-(m-phenoxyphenoxy benzene); 2-bromoethyl methyl ether; chlorendic anhydride; and the like; and mixtures thereof.

These sensitizers or photoinitiators are used in amounts ranging from about 2 to about 80 percent, and preferably from about 2 to about 70 percent, of the weight of the total composition.

Irradiation of the autophotopolymerizable compounds can be accomplished by any one or a combination of a variety of methods. The compounds may be exposed, for example, to actinic light from any source and of any type as long as it furnishes an effective amount of ultraviolet radiation, since the compounds of this invention activatable by actinic light generally exhibit their maximum sensitivity in the range of about 1800 A. to 4000 A., and preferably about 2000 A. to 3000 A.; electron beams, gamma radiation emitters; and the like; and combinations of these. Suitable sources include carbon arcs, mercury-vapor arcs, fluorescent lamps with special ultraviolet-light-emitting phosphors, argon glow lamps, photographic flood lamps, Van der Graaf accelerators, Resonant transformers, Betatrons, linear accelerators, and so forth.

The time of irradiation is not critical but must be sufficient to give the effective dosage. Irradiation may be carried out at any convenient temperature, and most suitably at room temperature for economic reasons. Distances of the radiation source from the work may range from about 1/8 inch to 10 inches, and preferably from about 1/8 inch to 3 inches.

The autophotopolymerizable compounds of the present invention are suitable for use in the absence of solvents and in the presence of oxygen as vehicles for paints, lacquers, and printing inks which are capable of setting or hardening after printing by exposure to radiation. They are suitable also as compositions and elements for the preparation of photographic images, printing plates, and rolls; as adhesives for foils, films, papers, fabrics, and the like; as coatings for metals, plastics, paper, wood, foils, textiles, glass, cardboard, box board, and the like; as markers for roads, parking lots, airfields, and similar surfaces; and so forth.

The new compounds of this invention are especially interesting because they are non-flammable per se and they impart fire-retardant properties to normally combustible substrates.

In addition to being autopolymerizable, these novel compounds can also serve as photoinitiators in photopolymerizable systems with other monomers, such as for example pentaerythritol triacrylate, pentaerythritol tetraacrylate, trimethylolpropane triacrylate, trimethylolethane trimethacrylate, dipentaerylthritol hexamethacrylate, and the like, and mixtures thereof.

Various dyestuffs, pigments, plasticizers, lubricants, and other modifiers may be incorporated to obtain certain desired characteristics in the finished products.

When the photopolymerizable compounds of the present invention are used as adhesives with lamina, at least one of the lamina must be translucent when ultraviolet light is used. When the radiation source is an electron beam or gamma radiation, at least one of the lamina must be capable of transmitting high energy electrons or gamma radiation, respectively, and neither is necessarily translucent to light. Typical laminations include polymer-coated cellophane to polymer-coated cellophane films, polymer-coated cellophane to polypropylene, Mylar to a metal substrate such as aluminum or copper, polypropylene to aluminum, and the like.

The photopolymerizable compounds of the present invention may be utilized for metal coatings and particularly for metals which are to be subsequently printed. Glass and plastics may also be printed or coated, and the coatings are conventionally applied by roller or spray. Pigmented coating systems may be used for various polyester and vinyl films; glass; polymer-coated cellophane; treated and untreated polyethylene, for example in the form of disposable cups or bottles; treated and untreated polypropylene; and the like. Examples of metals which may be coated include sized and unsized tin plate.

When used as vehicles for inks, e.g., printing inks, the compound may be pigmented with any of a variety of organic or inorganic pigments, e.g., molybdate orange, titanium white, chrome yellow, phthalocyanine blue, and carbon black, as well as colored with dyes. Stock which may be printed includes paper, clay-coated paper, and box board. In addition, the compositions of the present invention are suitable for the treatment of textiles, both natural and synthetic, e.g., in vehicles for textile printing inks or for specialized treatments of fabrics to produce water repellency, oil and stain resistance, crease resistance, etc.

Photopolymerizable elements of this invention comprises a support, e.g., a sheet or plate, having superimposed thereon a layer of the above-described photopolymerizable compound. Suitable base or support materials include metals, e.g., steel and aluminum plates; sheets; and foils;

and films or plates composed of various film-forming synthetic resins or high polymers, such as addition polymers, and in particular vinyl polymers, e.g., vinyl chloride polymers; vinylidene chloride polymers; vinylidene chloride copolymers with vinyl chloride, vinyl acetate, or acrylonitrile; and vinyl chloride copolymers with vinyl acetate or acrylonitrile; linear condensation polymers such as polyesters, e.g., polyethylene terephthalate; polyamides; etc. Fillers or reinforcing agents can be present in the synthetic resin or polymer base. In addition, highly reflective bases may be treated to absorb ultraviolet light, or a light absorptive layer can be transposed between the base and photopolymerizable layer.

Photopolymerizable elements can be made by exposing to radiation selected portions of the photopolymerizable layer thereof until addition polymerization is completed to the desired depth in the exposed portions. The unexposed portions of the layer are then removed, e.g., by the use of solvents which dissolve the monomer or prepolymer but not the polymer.

The invention and its advantages will be better understood with references to the following illustrative examples, but it is not intended to be limited thereto. In the examples, the parts are given by weight unless otherwise specified. Unless otherwise indicated, when the ingredient is solid at room temperature, the mixture may be heated to melt the solid ingredient, but generally not above 100° C., or it may be used in admixture with other liquid ingredients. The atmospheric and temperature conditions were ambient unless otherwise noted.

EXAMPLE 1

The following were charged into a 500-ml. three-necked flask equipped with a stirrer, a thermometer, and a Dean-Stark trap with a condenser:

| | |
|---|---|
| Benzene ml | 55 |
| 1,4,5,6,7,7 - hexachloro - 2,3 - bis(hydroxymethyl)-bicyclo(2,2,1)-5-heptene (HET-Diol) grams | 243 |
| Glacial acrylic acid do | 144 |
| Hydroquinone [1] do | 2 |
| Copper powder [1] do | 0.25 |
| Methyl sulfonic acid (catalyst) do | 2 |

[1] Polymerization inhibitions.

During a two-hour refluxing period at 120±3° C., regulated by the addition of the required amount of benzene, 23 ml. of water was collected from the water-benzene distillate. The reaction mixture was then cooled to 30–35° C., and 100 ml. of benzene was added; it was then washed with 400 ml. of 20% NaCl solution containing the required amount of 15% $Na_2CO_3$ solution to neutralize the excess acrylic acid. The neutral benzene solution was then washed three times, each with 200 ml. of saturated NaCl solution plus 15 ml. of 10% NaOH. The resulting benzene solution was dried over anhydrous $K_2CO_3$ and then filtered; the benzene was removed from the filtrate by evaporation on a steam bath. The yield of the diacrylate was 280 grams (89% of theory based on the HET-Diol). Analysis of the product, 1,4,5,6,7,7-hexachlorobicyclo (2,2,1)-5-heptene-2,3-bis(methylacrylate), indicated 99.8% of nonvolatiles and an equivalent weight of 240, based on selective saponification, compared with the theoretical value of 236. The HET-Diol diacrylate was a thick, light tan colored liquid having the refractive index of $n_D^{19.5°}=1.5545$.

The rate of the speed of polymerization of the product of Example 1 is compared with the rate of polymerization of pentaerythritol triacrylate in the presence and absence of a photoinitiator in Example 2.

EXAMPLE 2

A 0.25-mil thick sample of the HET-Diol diacrylate prepared in Example 1 was placed on a glass slide and exposed to actinic radiation at a distance of 10 inches from a 1200-watt Hanovia mercury arc ultraviolet lamp. The following tables gives the compositions, the cure times, and the properties of each cured film:

TABLE I

| Run | Film composition, percent A | B | Photoinitiator (Aroclor 4465) | Cure time, seconds | Film properties |
|---|---|---|---|---|---|
| 1 | 100 | | | 6.5 | Tough, flexible. |
| 2 | 70 | | 30 | 2.0 | Do. |
| 3 | | 100 | | >30 | Cheesy. |
| 4 | | 80 | 20 | 4.0 | Brittle, hard. |
| 5 | | 70 | 30 | 3.0 | Do. |

NOTE.—A is 1,4,5,6,7,7-hexachloro-bicyclo (2,2,1)-5-heptine-2,3-bis-(methylacrylate) (HET-Diol diacrylate): B is pentaerythritol triacrylate; Aroclor 4465 is Monsanto Chemical Co.'s mixture of bi- and triphenyls containing 65% of chlorine by weight.

These data show that HET-Diol diacrylate is superior to pentaerythritol triacrylate beta in the absence of a photoinitiator (Run 1 vs. Run 3) and in the presence of a photoinitiator (Run 2 vs. Runs 5 and 6).

EXAMPLE 3

The following were charged into a 500-ml. three-necked flask equipped with a stirrer, a thermometer, and a Dean-Stark trap with a condenser:

| | |
|---|---|
| Benzene ml | 65 |
| 2,4,5,6-tetrachlorobenzene-1,3-dimethanol grams | 100 |
| Glacial acrylic acid do | 108 |
| m-Nitrobenzene sulfonate [1] do | 0.5 |
| Copper powder [1] do | 0.125 |
| Sulfuric acid, 66° Bé. (catalyst) do | 2.75 |

[1] Polymerization inhibitors.

During a one-hour refluxing period at 120±3° C., regulated by the addition of the required amount of benzene, 12 ml. of water was collected from the water-benzene distillate. The reaction mixture was cooled to 30–35° C., and 100 ml. of benzene was added; it was then washed with 200 ml. of 20% NaCl solution containing the required amount of 15% $Na_2CO_3$ solution to neutralize the excess acrylic acid. The neutral benzene solution was then washed two times, each with 200 ml. of 20% NaCl solution plus 50 ml. of 15% $Na_2CO_3$ solution. The washed benzene solution was dried over anhydrous $K_2CO_3$ and then filtered; the benzene was removed from the filtrate by evaporation on a steam bath. The yield of the diacrylate was 123 grams (90% of theory based on the 2,4,5,6-tetrachlorobenzene-1,3-dimethanol). Analysis of the product, 2,4,5,6-tetrachlorobenzene-1,3-dimethylacrylate, indicated 99.8% of non-volatiles and an equivalent weight of 211, based on saponification, compared with the theoretical value of 210. The purified diacrylate was a white crystalline solid having a melting point of 111–113° C.

The rate of the speed of polymerization of the product of Example 3 is compared with the rate of polymerization of HET-Diol diacrylate and of pentaerythritol triacrylate in the presence and absence of a photoinitiator in Example 4.

EXAMPLE 4

A 0.25-mil thick sample of the 2,4,5,6-tetrachlorobenzene-1,3-dimethylacrylate prepared in Example 3 was placed on a glass slide and exposed to actinic radiation at a distance of 10 inches from a 1200-watt Hanovia mercury arc lamp.

TABLE II

| Run | Film composition, percent | | | | Cure time, seconds | Film properties |
|---|---|---|---|---|---|---|
| | A | B | C | Photoinitiator (Aroclor 4465) | | |
| 6 | 100 | | | | 6.5 | Tough, flexible. |
| 7 | 70 | | | 30 | 2.0 | Do. |
| 8 | | 100 | | | >30 | Cheesy. |
| 9 | | 80 | | 20 | 4.0 | Hard, brittle. |
| 10 | | 70 | | 30 | 3.0 | Do. |
| 11 | | | 100 | | 6.5 | Tough, flexible. |
| 12 | | | 70 | 30 | 2.0 | Do. |

NOTE.—A is HET-Diol diacrylate, the product of Example 1: B is pentaerythritol triacrylate; C is 2,4,5,6-tetrachlorobenzene-1,3-dimethylacrylate, the product of Example 3; Aroclor 4465 is a mixture of bi- and triphenyls containing 65% of chlorine by weight.

These data show that 2,4,5,6-tetrachlorobenzene-1,3-dimethylacrylate (Runs 11 and 12) and HET-Diol diacrylate (Runs 5 and 7) behave identically and that each is superior to pentaerythritol triacrylate (Runs 8, 9, and 10), particularly in the absence of a photoinitiator (6.5 seconds to cure for each of the compounds of this invention in contrast to over 30 seconds for the pentaerythritol triacrylate).

EXAMPLE 5

The procedure of Example 2, Runs 1 and 2, was repeated except that the diacrylate of 2,2′[isopropylidene bis (2,6-dichlorophenoxy)] dipropylene oxide diol was the monomer instead of HET-Diol diacrylate. The results were comparable.

EXAMPLE 6

The procedure of Example 2, Runs 1 and 2, was repeated except that the monomer was HET-Diol dimethacrylate instead of HET-Diol diacrylate. The results were comparable.

EXAMPLE 7

The procedure of Example 2, Runs 1 and 2, was repeated except that the monomer was HET-Diol diitaconate instead of HET-Diol diacrylate. The results were comparable.

EXAMPLE 8

The procedure of Example 2, Run 2, was repeated except that the photoinitiator was chlorinated rubber (Hercules' Parlon) instead of Aroclor 4465. The results were comparable.

EXAMPLE 9

The procedure of Example 4, Run 12, was repeated except that the photoinitiator was benzoin methyl ether instead of Aroclor 4465. The results were comparable.

EXAMPLE 10

A thin film (0.25-mil) of 1,4,5,6,7,7-hexachloro-bicyclo (2,2,1)-5-heptene-2,3-bis(methylacrylate) was applied to a sheet of aluminum plate and then exposed to a 1200-watt ultraviolet lamp at a distance of 2 inches. The film was dried in about 3 seconds.

EXAMPLE 11

The procedure of Example 10 was repeated except that the substrate was glass. The film dried in about 3 seconds.

EXAMPLE 12

The procedure of Example 10 was repeated except that the substrate was paper. The film dried in about 2 seconds.

EXAMPLE 13

The procedure of Example 10 was repeated except that the substrate was cardboard and the monomer was 2,4,5,6-tetrachlorobenzene-1,3-dimethylacrylate. The film dried in about 2 seconds.

EXAMPLE 14

A laminate was made of a film of polymer-coated cellophane and a film of oriented polypropylene with 1,4, 5,6,7,7 - hexachloro-bicyclo (2,2,1) - 5 - heptene-2,3-bis-(methylacrylate) between the two. The laminate was exposed to ultraviolet light as in Example 2, and a tight bond was effected in about 1 second.

EXAMPLE 15

A laminate was made of a sheet of copper and a film of Mylar with 2,4,5,6 - tetrachlorobenzene - 1,3 - dimethylacrylate between the two. The laminate was exposed to ultraviolet light as in Example 2, and a tight bond was effected in about 3 seconds.

EXAMPLE 16

A red ink was prepared from 80 percent of HET-Diol diacrylate and 20 percent of Lithol Rubine red pigment. A glass bottle printed with this ink was exposed to a 1200-watt Hanovia ultraviolet lamp at a distance of 2 inches. The ink dried in 3 seconds. It had excellent adhesion to glass and good grease- and rub-resistance.

EXAMPLE 17

A blue ink was prepared from 83 percent of 2,4,5,6-tetrachlorobenzene-1,3-dimethylacrylate and 17 percent of phthalocyanine blue. Untreated polypropylene was printed with the ink and subjected to ultraviolet light as in Example 2. After an exposure of 3 seconds, the ink was dry and adhered well to the substrate.

EXAMPLE 18

The procedure of Example 12 was repeated except that the coating was a 70:30 mixture of 2,4,5,6-tetrachlorobenzene-1,3-dimethylacrylate and Aroclor 4465. The coating dried in about 2 seconds.

EXAMPLE 19

The procedure of Example 10 was repeated except that the photopolymerizable composition was a 70:30 mixture of HET-Diol diacrylate and Aroclor 4465. The film dried in about 2 seconds.

EXAMPLE 20

The procedure of Example 14 was repeated except that the adhesive was a 70:30 mixture of HET-Diol diacrylate and Aroclor 4465. A tight bond was effected in about 1 second.

EXAMPLE 21

The procedure of Example 14 was repeated except that the adhesive was a 70:30 mixture of 2,4,5,6-tetrachlorobenzene 1,3-dimethylacrylate and Aroclor 4465. A tight bond was effected in about 1 second.

EXAMPLE 22

The procedure of Example 16 was repeated except that a 70:30 mixture of HET-Diol diacrylate and Aroclor 4465 used instead of the HET-Diol diacrylate a lone. The ink dried in 2 seconds.

EXAMPLE 23

The procedure of Example 16 was repeated except that the HET-Diol diacrylate was replaced by a 70:30 mixture of 2,4,5,6-tetrachlorobenzene-1,3-dimethylacrylate and Aroclor 4465. The ink dried in about 2 seconds.

EXAMPLE 24

The procedure of Example 2, Runs 1 and 2, was repeated except that the monomer was 2,4,5,6-tetrachlorobenzene-1,3-diitaconate instead of HET-Diol diacrylate. The results were comparable.

EXAMPLE 25

The procedure of Example 2, Runs 1 and 2, was repeated except that the monomer was 2,4,5,6-tetraiodobenzene-1,3-diacrylate instead of HET-Diol diacrylate. The results were comparable.

EXAMPLE 26

The procedure of Example 2, Runs 1 and 2, was repeated except that the monomer was 2,3,5,6-tetrafluorobenzene-1,4-dimethacrylate instead of HET-Diol diacrylate. The results were comparable.

EXAMPLE 27

The procedure of Example 2, Runs 1 and 2, was repeated except that the monomer was the dimethacrylate of 2,2′[isopropylidene bis (2,6 - dichlorophenoxy)] dipropylene oxide diol instead of HET-Diol diacrylate. The results were comparable.

EXAMPLE 28

The procedures of Examples 2 and 4 through 27 were repeated except that instead of being exposed to ultraviolet light the samples were passed on a conveyor belt beneath the beam of a Dynacote 300,000-volt linear electron accelerator at a speed and beam current so regulated as to produce a dose rate of 0.5 megarad.

These systems produced resinous materials of varying degrees of hardness in films from 0.5 to 20 mils thick having tacky surfaces.

EXAMPLE 29

The procedures of Example 2 was repeated except that the sample was simultaneously exposed to ultraviolet light as in Example 2 and electron beam radiation as in Example 28. The surface and interior of the film dried in 0.5 second, and the film was hard and tough.

EXAMPLE 30

The procedure of Example 29 was repeated except that the sample was exposed to ultraviolet light for ⅔ second before and ⅔ second after electron bombardment. The film was hard, tough, and flexible with a dry surface.

EXAMPLE 31

The procedure of Example 29 was repeated except that the sample was exposed to electron beam radiation before and after exposure to ultraviolet light for 0.25 second. The film was dry both internally and on the surface, and it was hard and tough.

EXAMPLE 32

The procedure of Example 29 was repeated except that the sample was exposed to ultraviolet light and then to electron beam radiation. The surface and interior of the film dried in about 1 second, and the film was hard and tough.

EXAMPLE 33

The procedure of Example 29 was repeated except that the sample was exposed to electron beam radiation and then to ultraviolet light. The surface and interior of the film dried in about 1 second, and the film was hard and tough.

While there are above disclosed but a limited number of embodiments of the process of the invention herein presented, it is possible to produce still other embodiments without departing from the inventive concept herein disclosed. It is desired, therefore, that only such limitations be imposed on the appended claims as are stated therein.

What is claimed is:

1. An ester of a poly halogenated benzyl polyhydric alcohol, said ester being a diacrylate, a dimethacrylate, a diitaconate, or a mixture thereof and the halogen being chlorine, bromine, iodine, or fluorine.

2. The diacrylate of 2,4,5,6-tetrachlorobenzene-1,3-dimethanol.

3. The dimethacrylate of 2,4,5,6-tetrachlorobenzene-1,3-dimethanol.

4. The diacrylate of 2,2′[isopropylidene bis (2,6-dichlorophenoxy)] dipropylene oxide diol.

5. The dimethacrylate of 2,2′[isopropylidene bis (2,6-dichlorophenoxy)] dipropylene oxide diol.

References Cited

UNITED STATES PATENTS

| | | | |
|---|---|---|---|
| 3,022,277 | 2/1962 | Nelson | 260—486 H |
| 3,278,580 | 10/1966 | Worsley, et al. | 260—486 H |
| 3,312,675 | 4/1967 | Caldwell | 260—486 H |
| 3,520,863 | 7/1970 | Anello, et al. | 260—486 H |

LORRAINE A. WEINBERGER, Primary Examiner
PAUL J. KILLOS, Assistant Examiner

U.S. Cl. X.R.

260—485 H